(12) United States Patent
Koey et al.

(10) Patent No.: US 9,000,589 B2
(45) Date of Patent: Apr. 7, 2015

(54) SEMICONDUCTOR DEVICE WITH REDISTRIBUTED CONTACTS

(75) Inventors: Dominic Poh Meng Koey, Kepong Baru (MY); Zhiwei Gong, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 159 days.

(21) Appl. No.: 13/483,064

(22) Filed: May 30, 2012

(65) Prior Publication Data

US 2013/0320530 A1 Dec. 5, 2013

(51) Int. Cl.
*H01L 23/48* (2006.01)
*H01L 21/56* (2006.01)
*H01L 23/00* (2006.01)
*H01L 23/31* (2006.01)

(52) U.S. Cl.
CPC ............... *H01L 21/56* (2013.01); *H01L 24/19* (2013.01); *H01L 24/97* (2013.01); *H01L 2224/04105* (2013.01); *H01L 2224/12105* (2013.01); *H01L 23/3128* (2013.01); *H01L 21/561* (2013.01)

(58) Field of Classification Search
USPC ................................. 257/738, 666, 670, 669
See application file for complete search history.

(56) References Cited

U.S. PATENT DOCUMENTS

| | | | |
|---|---|---|---|
| 6,744,118 B2 | 6/2004 | Ikenaga | |
| 7,674,656 B2 | 3/2010 | Wenzel | |
| 7,808,084 B1 | 10/2010 | Lee | |
| 2007/0126092 A1 | 6/2007 | San Antonio | |
| 2007/0212813 A1 | 9/2007 | Fay | |
| 2008/0283980 A1 | 11/2008 | Gao | |
| 2011/0165729 A1 | 7/2011 | Liu | |

*Primary Examiner* — Samuel Gebremariam
(74) *Attorney, Agent, or Firm* — Charles Bergere

(57) ABSTRACT

A surface mount semiconductor device is assembled by positioning an array of semiconductor dies with an array of metallic ground plane members between and beside the semiconductor dies. The arrays of dies and ground plane members are encapsulated in a molding compound. A redistribution layer is formed on the arrays of dies and ground plane members. The redistribution layer has an array of sets of redistribution conductors within a layer of insulating material. The redistribution conductors interconnect electrical contacts of the dies with external electrical contact elements of the device. As multiple devices are formed at the same time, adjacent devices are separated (singulated) by cutting along saw streets between the dies. The molding compound is interposed between tie bars of the ground plane members and the insulating material of the redistribution layer in the saw streets, and at the side surfaces of the singulated devices.

6 Claims, 3 Drawing Sheets

US 9,000,589 B2

SEMICONDUCTOR DEVICE WITH REDISTRIBUTED CONTACTS

BACKGROUND OF THE INVENTION

The present invention is directed to semiconductor device packaging and, more particularly, to a semiconductor device with redistribution connections between internal contacts on one or more semiconductor dies and external contacts on an active face of the device package.

Semiconductor dies are packaged in order to provide electrical connections between the die and external package contacts and to protect the die against mechanical and environmental stresses. Continued progress in reduction of the size of the semiconductor dies and increased functionality and complexity of the integrated circuits formed on the dies requires size reduction of the packaging with the same or greater complexity of the electrical connections with external circuits.

As part of the packaging or assembly process, the semiconductor dies are embedded or encapsulated with a molding compound. The electrical contacts for connection with external circuits are exposed at the active face of the package and connected internally with electrical contact pads on the semiconductor die. The external contacts may be a ball grid array (BGA) or a land grid array (LGA), for example. Various techniques are available for connecting the exposed, external electrical contacts of the package with the internal contacts of the embedded semiconductor die.

Minimum values are specified for the size of the individual exposed electrical contact surfaces at the active face of the device and for the spacing between adjacent electrical contact surfaces. Such specifications necessitate a compromise between the overall size of the active face of the device and the number of individual electrical contact surfaces.

In a technique known as Redistributed Chip Packaging (RCP), a redistribution layer provides interconnections between the internal set of contacts on the semiconductor die and the exposed device set of contacts at the active face of the device, to route signals and power and ground connections. In one technique of production of embedded RCP devices, singulated dies are placed temporarily with their active faces on a substrate. The dies are embedded with a molding compound and then released from the substrate, forming a panel. The panel can then be processed by wafer processing techniques to build up a redistribution layer that 'fans out' the internal contacts of the die set to the device set of exposed contacts, which covers an area greater than the area of the active face of the die. The redistribution layer may be built up by depositing successive layers of insulating material with electrical interconnectors in one or more layers, which may have vias providing connections between layers, separated from each other by insulating layers. The interconnections are typically deposited by electroplating techniques, and patterned using batch process lithography. Connection with signal input/output and power and ground pads on the active faces of the dies may be made during electro-deposition of the interconnectors and vias. The devices are singulated after completion of the redistribution layer.

The semiconductor device may include a metallic member extending beside the semiconductor die towards the edge of the semiconductor device and also embedded in the molding compound. Such a metallic member may be part of a ground plane, for example. In use of the device, such a ground plane may be connected or capacitively coupled to ground or to a stable voltage source to shield the device from electromagnetic interference caused by external circuits or sources of noise, or from unwanted electromagnetic coupling between adjacent circuit elements. Difficulties in ensuring manufacturing compatibility of such an embedded metallic member with the redistribution layer need to be overcome.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions in FIGS. 2 to 6 have been exaggerated relative to certain horizontal dimensions.

DETAILED DESCRIPTION OF THE INVENTION

Figure 1:
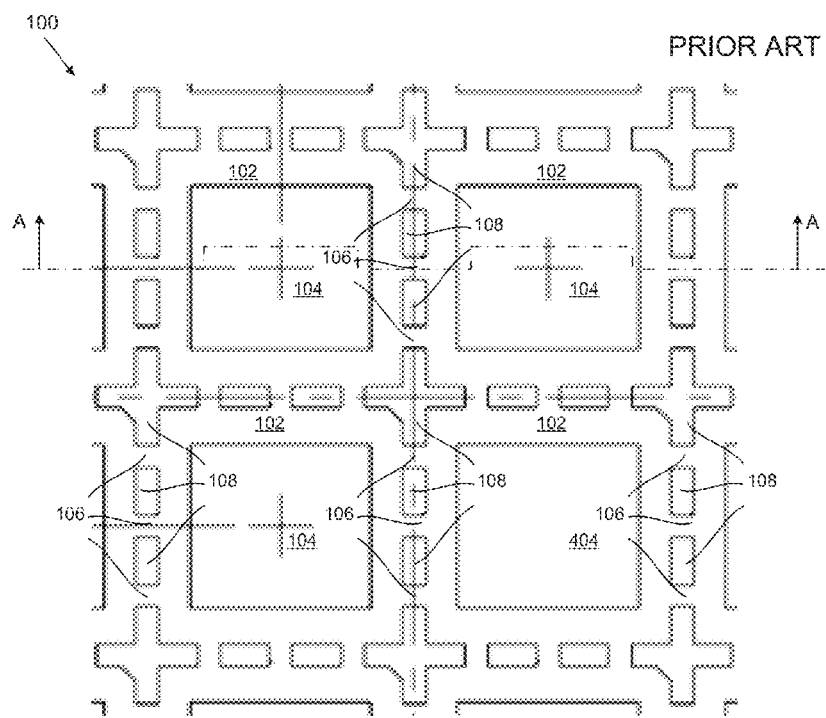
FIG. 1 is a plan view of a conventional ground plane member for use in making redistributed chip package semiconductor devices.

FIG. 1 is a plan view of a conventional ground plane member 100 for an array of Redistributed Chip Package (RCP) semiconductor devices. The ground plane member 100 comprises an array of frame elements 102 surrounding respective apertures 104, which will receive one or more semiconductor dies (not shown in FIG. 1), and may also receive passive devices such as capacitors or inductors for example. Adjacent frame elements 102 are connected by tie bars such as 106, to enable the ground plane member 100 to be handled as a unit. Between adjacent tie bars 106 are apertures such as 108, through which molding compound can flow during encapsulation. The ground plane member is made of a suitable material such as copper or aluminium, for example, so that it may be connected or capacitively coupled to ground or to a stable voltage source to shield the device from electromagnetic interference with external circuits or sources of noise, or from unwanted electromagnetic coupling between adjacent circuit elements, for example.

Figure 2:
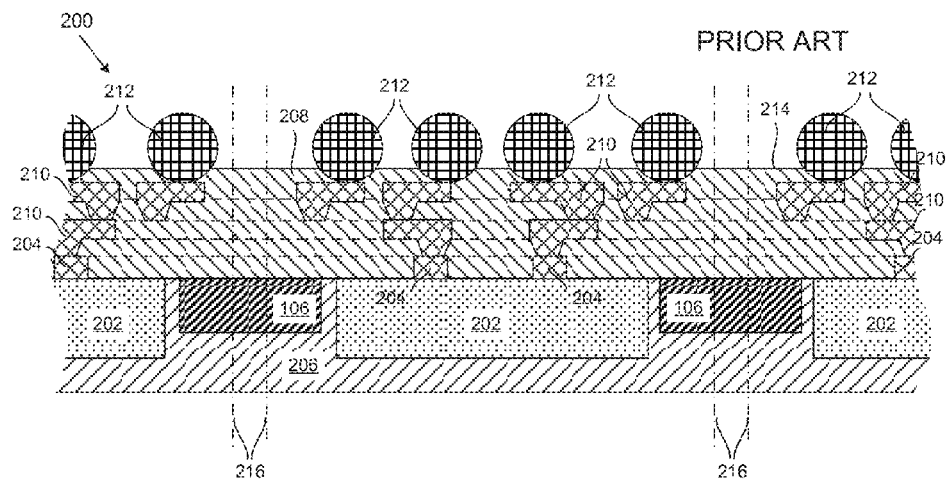
FIG. 2 is a sectional view along the line A-A of FIG. 1 of an array of conventional redistributed chip package semiconductor devices, in which the ground plane member of FIG. 1 has been added, before singulation.

FIG. 2, at a different scale from FIG. 1 and after RCP processing, shows part of a panel 200 including conventional RCP devices, in which the ground plane member 100 has been added as an embedded element. The panel 200 comprises an array of singulated semiconductor dies 202 positioned in the apertures 104 of the ground plane member 100. Each of the semiconductor dies 202 has an active face presenting a die set of electrical contact elements such as 204 and a further die face opposite the active face. The panel 200 is encapsulated with the further face of the semiconductor dies 202 and the ground plane member 100 embedded in a molding compound 206. A redistribution layer is provided at a face of the encapsulated panel 200, the redistribution layer including a layer of insulating material 208, and an array of sets of redistribution conductors such as 210 within the insulating material 208. An array of solder balls 212 at an active face 214 of the redistribution layer provide device is coupled with sets of electrical contact elements. The sets of solder balls 212 are interconnected with the die sets of electrical contact elements 204 by the sets of redistribution conductors such as 210 and are of larger size and spacing than the electrical contact elements 204 of the die sets.

Figure 3:
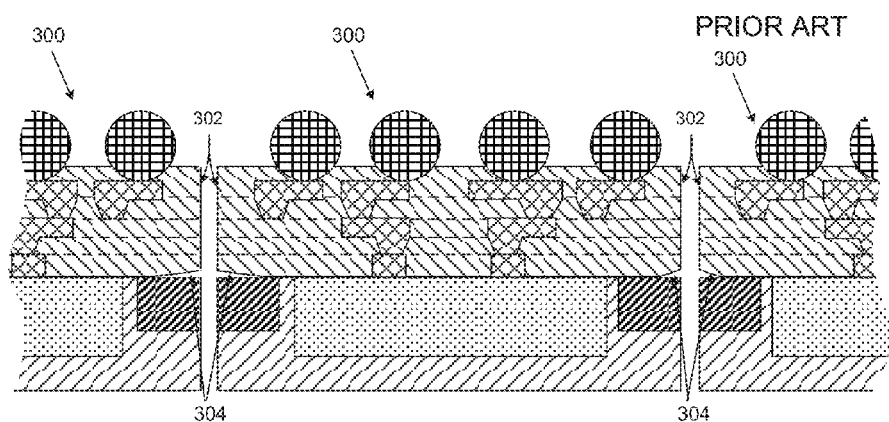
FIG. 3 is a sectional view along the line A-A of FIG. 1 of the array of redistributed chip package semiconductor devices of FIG. 2 after singulation.

During the production process, the individual semiconductor devices are singulated by sawing through the panel 200 along saw streets indicated by chain-dotted lines at 216, to produce singulated devices 300, as shown in FIG. 3, having side surfaces 302. At the side surfaces 302, the bars 106 of the ground plane member 100 interface directly with the insulating material 208 of the redistribution layer. In this situation, delamination occurs systematically during the singulation operation between the insulating material 208 and the bars 106 of the ground plane member 100, as shown at 304. The insulating material 208 may also chip or peel off. Such defects lead to high levels of product rejection.

Figure 4:
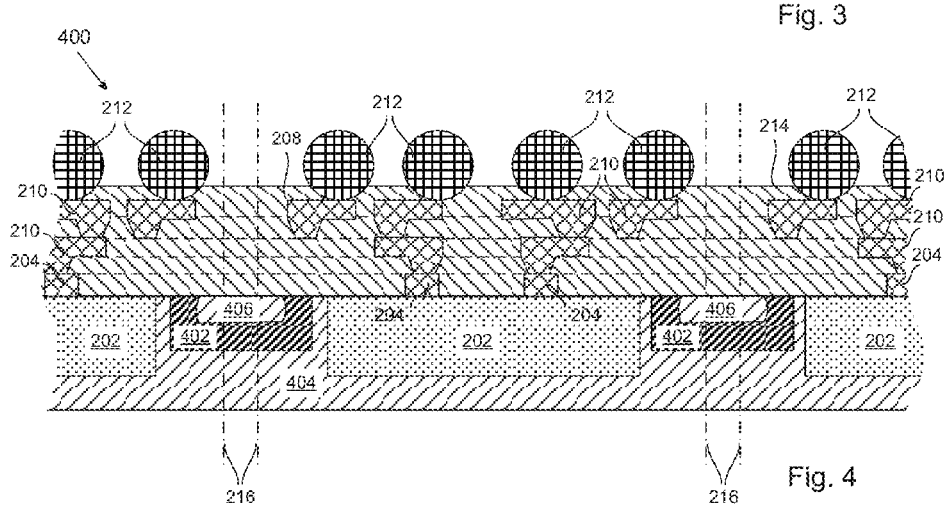
FIG. 4 is a sectional view along the line A-A of FIG. 1 of an array of redistributed chip package semiconductor devices in accordance with one embodiment of the invention, given by way of example, before singulation
Figure 5:
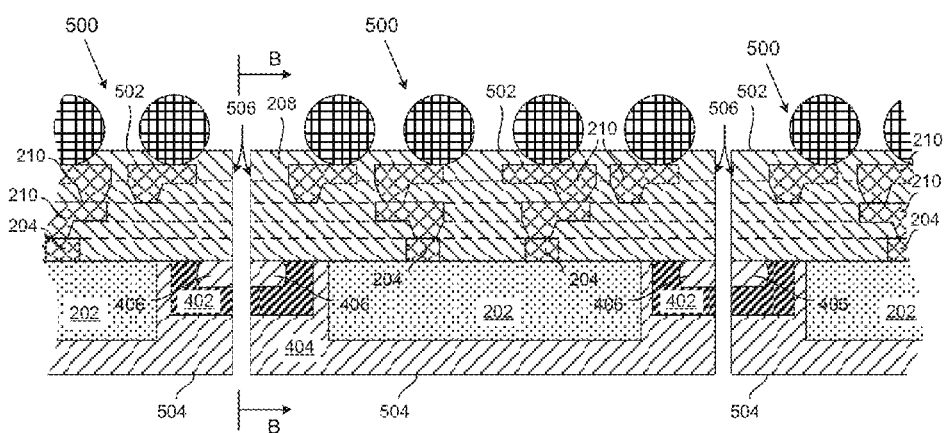
FIG. 5 is a sectional view along the line A-A of FIG. 1 of the array of redistributed chip package semiconductor devices of FIG. 4 after singulation.
Figure 6:
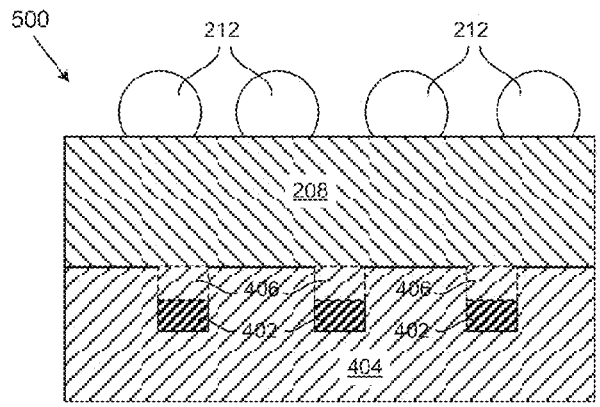
FIG. 6 is a side view of one of the redistributed chip package semiconductor devices of FIGS. 4 and 5 from the line B-B in FIG. 5.

FIG. 4 illustrates a panel 400 of surface mount semiconductor devices before singulation, and FIGS. 5 and 6 illustrate the surface mount semiconductor devices 500 after singulation, in accordance with an example of an embodiment of the present invention. The singulated semiconductor devices 500 have first and second opposed faces 502 and 504 and a side surface 506 transverse to the opposed faces. In this example, the faces 502 and 504 are rectangular and the side surface 506 has four facets corresponding to the edges of the faces 502 and 504, although other shapes are possible. Each semiconductor device 500 comprises one or more semiconductor dies 202 each having an active face presenting a die set of electrical contact elements 204 and a further die face opposite the active face. Additional components, such as passive components, may also be included in the semiconductor devices 500.

In the panel 400, before singulation, the semiconductor devices 500 are disposed in an array. An array of metallic members 402 is provided extending between and beside the semiconductor dies 202. The array of semiconductor dies 202 and the array of the metallic members 402 are encapsulated with the further die face and the metallic members 402 embedded in a molding compound 404. A redistribution layer is provided on a face of the encapsulated arrays of semiconductor dies 202 and of the metallic members 402. In this example, the array of metallic members 402 are part of a ground plane member like the ground plane member 100 but which is adapted so that the molding compound 404 will be interposed between the metallic members 402 and the redistribution layer at the side surfaces 506.

The redistribution layer includes a layer of insulating material 208, and an array of sets of redistribution conductors such as 210 within the insulating material 208. An array of device sets of electrical contact elements 212 are provided on the redistribution layer at the second face of the device with the sets of redistribution conductors 210 interconnecting electrical contact elements 204 of the die sets with electrical contact elements 212 of the device sets respectively. The devices are singulated by sawing through the molding compound 404, the array of metallic members 402 and the layer of insulating material 208 along saw streets between and beside the semiconductor dies as indicated by chain-dotted lines 216. The molding compound 404 is interposed between the metallic members 402 and the insulating material 208 of the redistribution layer in the saw streets 216. The interposed molding compound 404 interfaces with the insulating material 208 of the redistribution layer at the side surfaces 506 of the semiconductor devices 500, and there is no interface between the metallic members 402 and the insulating material 208 of the redistribution layer in the saw streets 216.

The metallic members 402 surround respective ones of the semiconductor dies 202 and present apertures within which the respective semiconductor dies 202 are positioned. Before singulation, are connected by bar elements extending across the saw streets 216 similar in plan view to the tie bars 106, so that the bar elements are severed by singulating the devices 500. The metallic members 402 have interfaces with the layer of insulating material 208 within the semiconductor device 500, but the bar elements present recesses 406 at the saw streets 216 accommodating the interposed molding compound 404 before singulation, the recesses extending inwards from the side surfaces 506 of the semiconductor devices after singulation. In this example, the recesses 406 are presented by a reduction in thickness of the bar members, and the recesses may be formed by etching part way through the thickness of the bar members. However, other suitable techniques of production of the metallic members, such as stamping or pressing for example, may form the recesses without reduction in thickness of the bar members. For example, the recesses 406 may occupy 60% of the non-etched thickness of the bar members. In one implementation, the non-etched thickness of the bar members is 0.075 mm.

The semiconductor devices 500 are singulated using a saw (not shown). FIG. 6 is a side view from the line B-B of FIG. 5 of a singulated semiconductor device 500 showing the side surface 506, whose different materials are distinguished by hatching of the same formats as in the sectional views of FIGS. 4 and 5, and the parts of the recesses 406 embedded in the interposed molding material 404 behind the side surface 506 are indicated by dashed lines. Before singulation, the molding compound 404 is interposed between the metallic members 402 and the insulating material 208 of the redistribution layer over a length of the recesses 406 in the bar elements transverse to the saw street 216 which is at least twice the width of the saw. This reduces the risk of delamination or chipping of the insulating material 208. In one implementation, the saw width is 0.3 mm and the length of the recesses 406 is at least 0.6 mm. In this example, the molding compound 404 is interposed between the metallic members 402 and the insulating material 208 of the redistribution layer over a length of the recesses 406 transverse to the saw street 216 which is at least 2.5 times the width of the saw. In an implementation where the saw width is 0.3 mm, the length of the recesses 406 is at least 0.8 mm. The saw street 216 is itself larger than the width of the saw and includes tolerances for the positioning of the saw and the width of the resulting kerf, for example. The width of the saw street 216 is twice or more the width of the saw in this example. In addition, the length of the recesses 406 includes a sufficient margin beyond the width of the saw street to reduce or eliminate stress from the saw being applied during singulation to the interfaces between the metallic members 402 and the layer of insulating material 208 beyond the recesses 406.

The molding material 404 may be any suitable molding material, such as a silica-filled epoxy material for example. Characteristics of such molding material include adhesion both to the material of the metallic members 402 and to the insulating material 208 of the redistribution layer and sufficient elasticity to tolerate deformation of the panel 400 during singulation. The choice of the insulating material 208 of the redistribution layer still takes account of their characteristics of strength and/or adhesion to the material of the metallic members 402 and the semiconductor dies 202, but other characteristics may be prioritized for the choice of the insulating material 208, such as its dielectric properties and its suitability for building up successive layers. A typical material such as polyimide material may therefore be chosen for the insulating material 208.

In this example, encapsulating the array of semiconductor dies 202 and the array of the metallic members 402 in the molding compound 404 comprises mounting the semiconductor dies 202 with the active face contacting a substrate (not shown), mounting the array of the metallic members 402 on the substrate, applying the molding compound 404 to encapsulate the array of semiconductor dies 202 and the array of the metallic members 402 and to interpose the molding compound 404 between the metallic members 402 and the substrate in the saw streets 216, and removing the substrate. In this example, the metallic members 402 are formed in plan view like the ground plane member 100. The metallic members 402 form tie bars connecting adjacent frame members. The recesses 406 extend over the whole widths of the tie bars and between adjacent tie bars are apertures through which molding compound can flow into the recesses 406 during encapsulation.

A method of making a surface mount semiconductor device, such as the device 500, having first and second opposed faces 502 and 504 and a side surface 506 transverse to the opposed faces, in accordance with an example of an embodiment of the invention, comprises providing an array of semiconductor dies 202 each having an active face presenting a die set of electrical contact elements 204 and a further die face opposite the active face. An array of metallic members 402 is provided extending between and beside the semiconductor dies 202. The array of semiconductor dies 202 and the array of the metallic members 402 are encapsulated with the further die face and the metallic members 402 embedded in a molding compound 404. A redistribution layer is provided on the arrays of semiconductor dies 202 and of the metallic members 402, the redistribution layer including a layer of insulating material 208, and an array of sets of redistribution conductors such as 210 within the insulating material 208. An array of device sets of electrical contact elements 212 are provided on the redistribution layer at the second face of the device with the sets of redistribution conductors 210 interconnecting electrical contact elements 204 of the die sets with electrical contact elements 212 of the device sets respectively. The devices are singulated, including sawing through the molding compound 404, the array of metallic members 402 and the layer of insulating material 208 along saw streets 216 between and beside the semiconductor dies. The molding compound 404 is interposed between the metallic members 402 and the insulating material 208 of the redistribution layer in the saw streets 216.

In this example, providing the redistribution layer comprises forming interfaces between the metallic members 402 and the layer of insulating material within the semiconductor devices 500. However, the bar elements 402 present recesses 406 at the saw streets 216 accommodating the interposed molding compound 404. In this example, the recesses 406 are presented by a reduction in thickness of the bar members, and the recesses may be formed by etching part way through the thickness of the bar members. However, other suitable techniques of production of the metallic members, such as stamping or pressing for example, may form the recesses without reduction in thickness of the bar members The semiconductor devices 500 are singulated using a saw (not shown), and the molding compound 404 is interposed between the metallic members 402 and the insulating material 208 of the redistribution layer over a length transverse to the saw street 216 which is at least twice the width of the saw. This reduces the risk of delamination or chipping of the insulating material 208. In this example, the molding compound 404 is interposed between the metallic members 402 and the insulating material 208 of the redistribution layer over a length transverse to the saw street 216 which is at least 2.5 times the width of the saw. The saw street is itself larger than the width of the saw, and is twice or more the width of the saw in this example. In addition, a sufficient margin beyond the width of the saw street is provided to reduce or eliminate stress from the saw being applied to the interfaces between the metallic members 402 and the layer of insulating material 208 beyond the recesses 406.

In this example, encapsulating the array of semiconductor dies 202 and the array of the metallic members 402 in the molding compound 404 comprises mounting the semiconductor dies 202 with the active face contacting a substrate (not shown), mounting the array of the metallic members 402 on the substrate, applying the molding compound 404 to encapsulate the array of semiconductor dies 202 and the array of the metallic members 402 and interpose the molding compound 404 between the metallic members 402 and the substrate in the saw streets 216, and removing the substrate. In this example, the metallic members 402 are formed in plan view like the ground plane member 100 but adapted by forming the recesses 406. The metallic members 402 form tie bars connecting adjacent frame members. The recesses 406 extend over the whole widths of the tie bars and between adjacent tie bars are apertures through which molding compound can flow into the recesses 406 during encapsulation.

Figure 7:
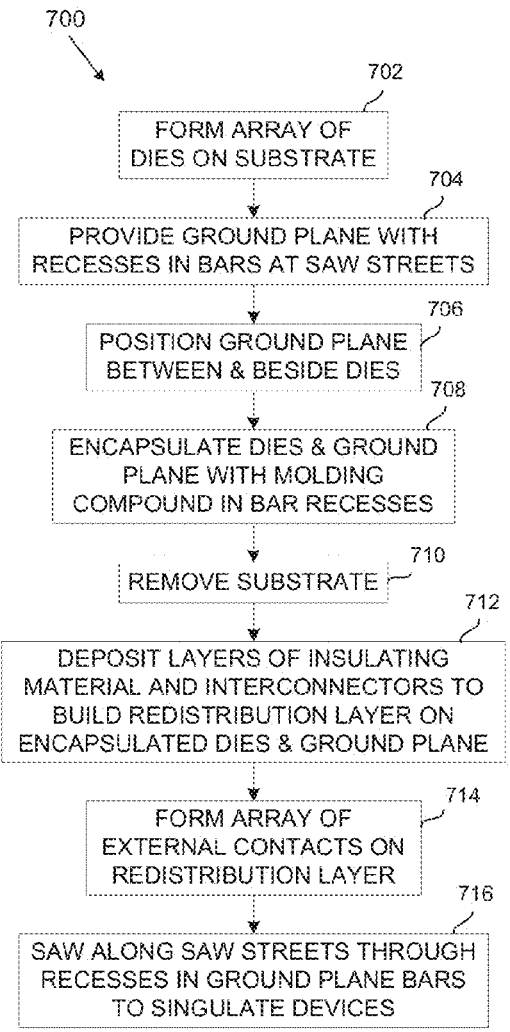
FIG. 7 is a flow chart illustrating a method of assembling a redistributed chip package semiconductor device in accordance with an embodiment of the invention, given by way of example.

FIG. 7 is a flow chart illustrating in more detail a method 700 of making a surface mount semiconductor device in accordance with an example of an embodiment of the invention. At 702, an array of semiconductor dies 202 is formed with the active faces contacting a substrate. At 704, an array of metallic ground plane members 402 is formed with tie bars having recesses 406 crossing the saw streets 216 of the arrays. At 706, the array of metallic ground plane members 402 is positioned on the substrate, extending between and beside the semiconductor dies 202. At 708, molding compound 404 is applied to encapsulate the array of semiconductor dies 202 and the array of the metallic members 402 and interpose the molding compound 404 between the metallic members 402 and the substrate in the recesses 406, and the substrate is removed at 710.

In the method 700, a redistribution layer is then provided at 712 by depositing successive layers of insulating material and of conductive material forming interconnections, together with vias connecting traces in successive conductive layers if there are more than one. The redistribution layer is built on a face of the panel 400 at which the active faces of the semiconductor dies 202 and the metallic ground plane members 402 are exposed. At 714, an array of device sets of external contacts 212 are formed on the face 502 of the devices 500 and the devices 500 are singulated at 716 by sawing through the molding compound 404, the tie bars of the metallic ground plane members 402 and the layer of insulating material 208 along the saw streets 216 between and beside the semiconductor dies.

In the foregoing specification, the invention has been described with reference to specific examples of embodiments of the invention. It will, however, be evident that various modifications and changes may be made therein without departing from the broader spirit and scope of the invention as set forth in the appended claims.

For example, the semiconductor material of the dies described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A surface mount semiconductor device having first and second opposed faces and a side surface transverse to said opposed faces, the device comprising:
   a semiconductor die having an active face presenting a die set of electrical contact elements and a further die face opposite said active face;
   a metallic member with bar elements extending beside said semiconductor die to said side surface;
   a molding compound extending to said first face and to said side surface and embedding said metallic member and said further die face of said semiconductor die;
   a device set of electrical contact elements at said second face; and
   a redistribution layer including a layer of insulating material extending to said side surface, and redistribution conductors within said insulating material interconnecting said electrical contact elements of said die set with said electrical contact elements of said device set;
   wherein said bar elements have recesses at said side surface such that said molding compound is interposed between said metallic member and said insulating material of said redistribution layer at said side surface.

2. The semiconductor device of claim 1, wherein said metallic member surrounds said semiconductor die and presents an aperture within which said semiconductor die is positioned.

3. The semiconductor device of claim 2, wherein said metallic member has an interface with said layer of insulating material within the semiconductor device.

4. The semiconductor device of claim 3, wherein said recesses are presented by a reduction in thickness of said bar members.

5. The semiconductor device of claim 1, wherein said die set of electrical contact elements comprises an array of conductive pads.

6. The semiconductor device of claim 1, said device set of electrical contact elements comprises an array of solder balls.

* * * * *